US005920275A

United States Patent [19]
Hester

[11] Patent Number: 5,920,275
[45] Date of Patent: Jul. 6, 1999

[54] ANALOG-TO-DIGITAL CONVERTER USING WEIGHTED CAPACITOR ARRAY AND INTERPOLATING COMPARATOR

[75] Inventor: Richard K. Hester, Whitewright, Tex.

[73] Assignee: Iowa State University Research Foundation, Inc., Ames, Iowa

[21] Appl. No.: 08/925,631

[22] Filed: Sep. 9, 1997

Related U.S. Application Data

[60] Provisional application No. 60/024,722, Sep. 9, 1996.

[51] Int. Cl.$^6$ ................................................ H03M 1/14
[52] U.S. Cl. .......................................... 341/172; 341/155
[58] Field of Search ................................... 341/118, 122, 341/161, 159, 155, 156, 172; 327/94

[56] References Cited

U.S. PATENT DOCUMENTS

| | | | |
|---|---|---|---|
| 4,072,939 | 2/1978 | Heller et al. | 340/347 |
| 4,129,863 | 12/1978 | Gray et al. | 340/347 |
| 4,195,282 | 3/1980 | Cameron | 340/347 |
| 4,196,420 | 4/1980 | Culmer et al. | 340/347 |
| 4,200,863 | 4/1980 | Hodges et al. | 340/347 |
| 4,224,605 | 9/1980 | Michaud et al. | 340/347 |
| 4,325,055 | 4/1982 | Colardelle et al. | 340/347 |
| 4,336,526 | 6/1982 | Weir | 340/347 |
| 4,348,658 | 9/1982 | Carter | 340/347 |
| 4,620,179 | 10/1986 | Cooper et al. | 340/347 |
| 4,641,129 | 2/1987 | Doluca et al. | 340/347 |
| 4,812,817 | 3/1989 | Bernard | 341/172 |
| 4,989,004 | 1/1991 | Kanayama | 341/161 |
| 5,006,853 | 4/1991 | Kiriaki et al. | 341/156 |
| 5,014,055 | 5/1991 | Dingwall et al. | 341/159 |
| 5,138,319 | 8/1992 | Tesch | 341/156 |
| 5,218,362 | 6/1993 | Mayes et al. | 341/121 |
| 5,235,333 | 8/1993 | Naylor et al. | 341/118 |
| 5,247,210 | 9/1993 | Swanson | 307/355 |
| 5,258,761 | 11/1993 | Fotouhi et al. | 341/172 |
| 5,287,108 | 2/1994 | Mayes et al. | 341/156 |
| 5,321,403 | 6/1994 | Eng, Jr. et al. | 341/168 |
| 5,465,093 | 11/1995 | Kusumoto et al. | 341/122 |

OTHER PUBLICATIONS

Kusumoto, K., et al., "A 10–b 20–MHz 30 mW Pipelined Interpolating CMOS ADC", *IEEE Journal of Solid–State Circuits vol. 28*, 1200–1206 (Dec. 1993).

Lee, S.H., et al., "Digital–Domain Calibration of Multistep Analog–to–Digital Converters", *IEEE Journal of Solid–State Circuits*, 27, 1679–1688 (Dec. 1992).

Tewksbury III, T.L., et al., "Characterization, Modeling, and Minimization of Transient Threshold Voltage Shifts in MOFSET's",*IEEE Journal of Solid–State Circuits*, 29, 239–252 (Mar. 1994).

*Primary Examiner*—Marc S. Hoff
*Assistant Examiner*—Peguy JeanPierre
*Attorney, Agent, or Firm*—Schwegman, Lundberg, Woessner, and Kluth, P.A.

[57] ABSTRACT

A charge redistribution analog-to-digital converter uses an interpolative comparator to determine multiple bits in a single comparator decision cycle. The result is a speed improvement in the conversion period with little or no increase in power dissipation.

5 Claims, 4 Drawing Sheets

ANALOG-TO-DIGITAL CONVERTER USING WEIGHTED CAPACITOR ARRAY AND INTERPOLATING COMPARATOR

This application claims the benefit under 35 U.S.C. § 119(e) of U.S. Provisional Application No. 60/024,722, filed on Sep. 9, 1996.

TECHNICAL FIELD OF THE INVENTION

The present invention pertains generally to analog-to-digital converters, and more particularly to a charge redistribution analog-to-digital converter.

BACKGROUND OF THE INVENTION

U.S. Pat. No. 4,129,863, to Gray et al., describes a successive approximation, charge redistribution conversion technique commonly used in electronic products today. The technique described in Gray et al. employs an array of binary weighted capacitors that are switched in sequence to divide a reference signal into binary weighted fractions and combine the fractions with a signal to be quantized. A comparator receives the combined signal, compares it against a reference voltage, and produces a serial one-bit data output that, when the conversion is complete, forms a digital word representing the level of the signal to be quantized.

The increased emphasis on low power consumption and mixed-signal CMOS application-specific circuits will result in even more reliance on the Gray et al. circuit technique. However, a drawback to the circuit described in the Gray et al. patent is that the successive approximation conversion algorithm is inherently slow because the comparator determines only one digital bit during each of its decision cycles. Thus, for example, conversion to a 16-bit resolution result requires 16 comparator decision cycles.

SUMMARY OF THE INVENTION

The present invention addresses the above-noted drawback in the Gray et al. architecture. In the successive approximation charge redistribution conversion circuit of the present invention, more than one bit is determined each decision cycle of the converter, providing a basis for improving the speed of the converter.

The present invention provides a charge redistribution, successive approximation analog-to-digital converter which produces a digital approximation of an analog input signal. The converter includes a binary weighted capacitor array, an interpolative comparator receiving the output of the array, and a memory circuit holding a word of digital data comprising successive approximation of the digital approximation, with the word of digital data including at least two bits determined from the output of the interpolative comparator on a single cycle of the converter.

The present invention also provides a method of successive approximation of a digital representation of an analog input signal using a binary weighted capacitor array for charge redistribution and a comparator receiving the output of the array wherein the bits of the digital approximation are determined on successive cycles. The method is characterized in that the comparator is an interpolative comparator and in that more than one bit of the digital approximation is determined on each successive cycle.

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

Figure 1:
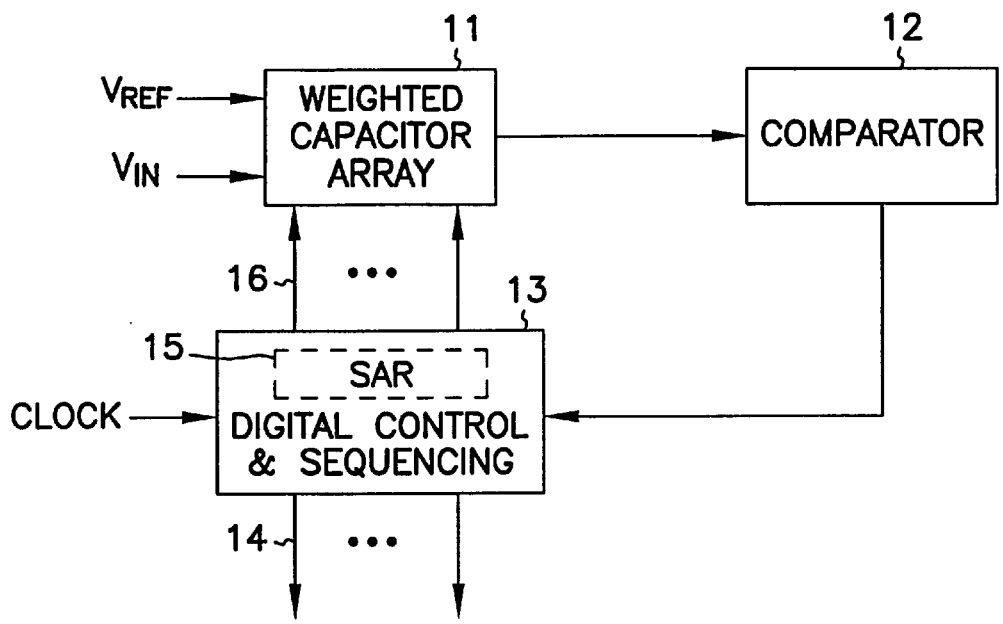
FIGS. 1 and 2 illustrate a prior art charge redistribution analog-to-digital converter.
Figure 2:
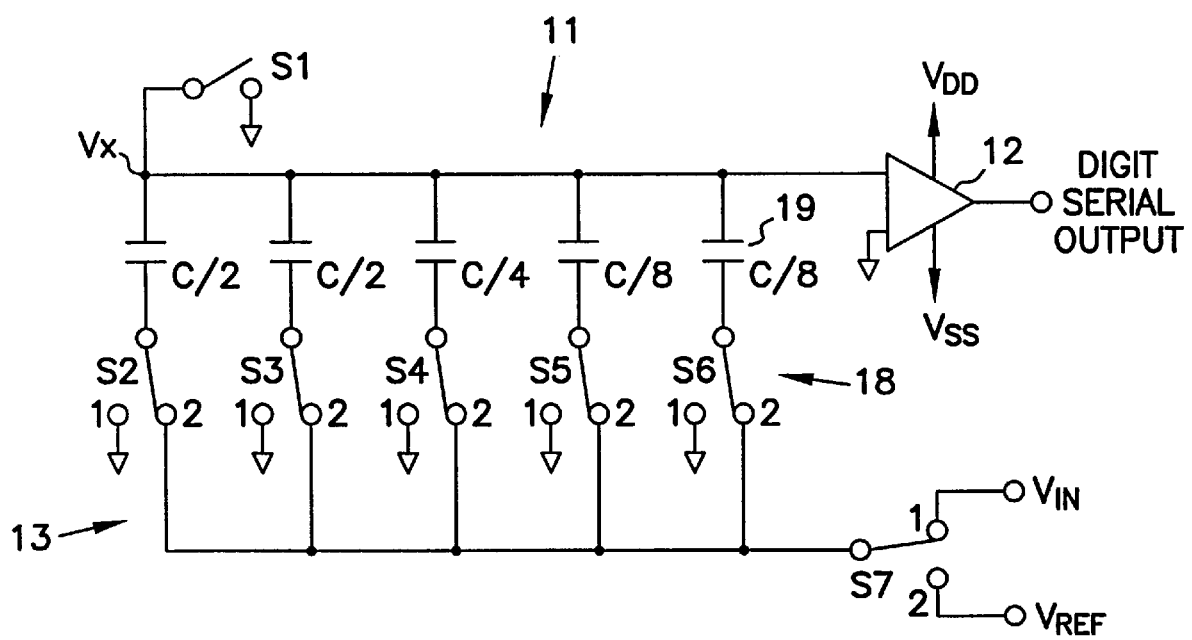

As noted above, U.S. Pat. No. 4,129,863, to Gray et al., describes a charge redistribution conversion technique commonly used in products today. FIGS. 1 and 2 illustrate the prior art Gray et al. converter. Referring to FIG. 1 of the drawings, a block diagram of one embodiment of a well-known prior art device for converting between analog and digital signal forms is shown. A weighted capacitor array 11 is shown receiving an analog reference signal $V_{REF}$ and an analog signal $V_{IN}$. Weighted capacitor array 11 produces a successive approximation signal $V_X$ which is connected to a comparator 12. Comparator 12 produces a serial digital output which is coupled to a digital control and sequencing circuit 13. A plurality of digital data output terminals 14 is available at digital control sequencing circuit 13. Digital control sequencing circuit 13 receives a clock input for providing sequence dwell time and produces a series of switching functions on a plurality of switching function terminals 16 coupled to weighted capacitor array 11 coupled to comparator 12. Circuit 13 includes a successive approximation register (SAR) 15 which contains the most recent digital approximation of the analog input signal.

FIG. 2 shows the weighted capacitor array 11 in circuit with a plurality of switches 18 included in digital control and sequencing circuit 13 for controlling charge placed on individual ones of the capacitors in the capacitor array 11 and for connecting thereto predetermined ones of the analog signal $V_{IN}$, analog reference signal $V_{REF}$ and the reference signal for comparator 12, which is shown in FIG. 2 as ground. One terminal of all of the capacitors in the array is connected to a common point and in turn connected to one input of comparator 12. The voltage at the common point or the input to comparator 12 is designated as $V_X$. A switch S1 is provided for selectively placing the common point for the capacitors in the array at ground potential. Another switch S7 is provided for selecting the analog signal $V_{IN}$ or the analog reference signal $V_{REF}$. It should be noted that digital control and sequencing circuit 13 includes sequencing and control logic which controls all of the switches in the circuit on the time base provided by the clock input to the digital control and sequencing circuit 13. The capacitors in the weighted capacitor array 11 have values as indicated in the example of FIG. 2 corresponding to a predetermined number of binary bits ranging from a most to a least significant bit. The capacitor representing the most significant bit is marked C and that representing the least significant bit is marked C/8. An additional capacitor 19 is provided having a capacitance value equivalent to that of the capacitor representing the least significant bit, which is in this example C/8. It is seen in FIG. 2 that one terminal on additional capacitor 19 is also connected to the common point at one input to comparator 12.

The plurality of switches 18 are designated S2 through S6 in this example, each having terminals marked 1 and 2. Switches S2 through S6 selectively place the other terminal on individual capacitors in the capacitor array 11 to ground potential in position 1 or to switch S7 in position 2. Switch S7 in turn has two positions 1 and 2 for selecting the analog signal $V_{IN}$ or the analog reference signal $V_{REF}$ respectively. As indicated in FIG. 2, a digit serial output is provided by comparator 12 in accordance with the successive approximation signal level $V_X$. The digit serial output is connected to digit control and sequencing circuit 13 as mentioned above for controlling the sequence and control logic and the switching sequence of switches S1 through S7.

As is well known in the art and as is further described in the Gray et al. patent, switches S1–S7 are sequenced so that in each cycle of the conversion the input voltage $V_{IN}$ is added to binary weighted fractions of $V_{REF}$, obtained with the binary weighted capacitors in array 11. The fractions to be added are set according to the approximation made in a previous cycle (or an initial approximation). On each cycle, the output of the capacitor array 11 is compared against a further reference (e.g. ground) to ascertain another bit in the digital word to be determined. In the Gray et al., architecture, the digital word is determined one bit at a time, which inherently limits the speed of the conversion.

Figure 3:
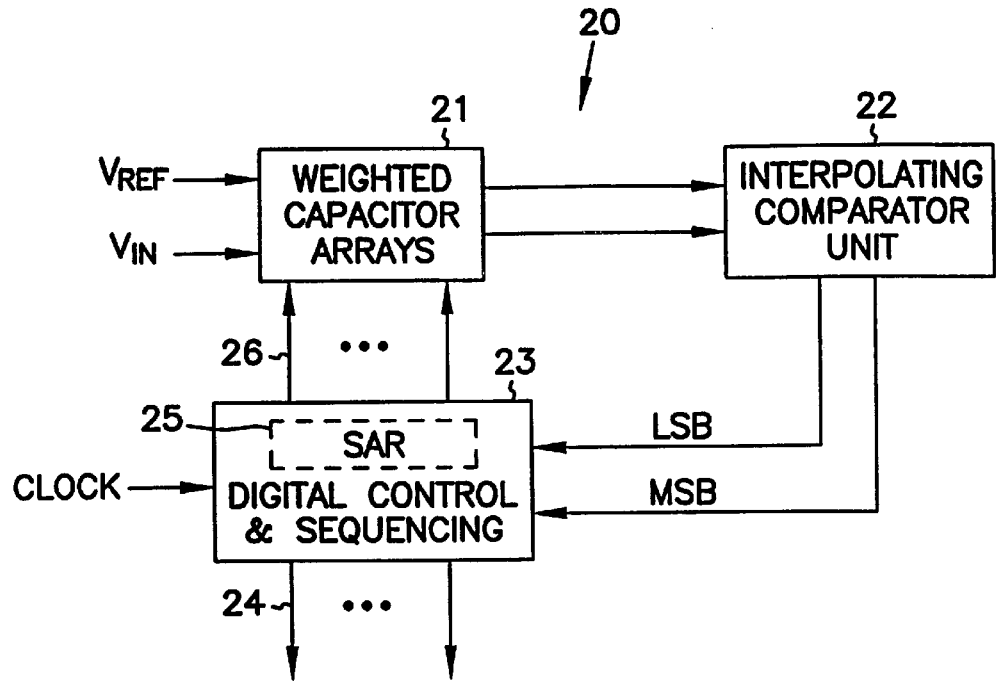
FIG. 3 is a block diagram of an exemplary embodiment of an improved charge redistribution analog-to-digital converter according to the present invention.

Referring now to FIG. 3, there is illustrated an exemplary embodiment 20 of the charge redistribution analog-to-digital converter according to the present invention. Embodiment 20 is similar to that of the FIG. 1, except that an interpolating comparator unit 22 is used in place of comparator 12, and the binary weighted capacitor array 11 is modified to produce a pair of output voltages $V_X$ for application to interpolating comparator unit 22. The successive approximation register (SAR) 25 contains the most recent digital approximation to the analog input signal $V_{IN}$ that is the input to the capacitor array 21. The array 21 is modified to provide two analog signals to the comparator representing the upper and lower bounds of the uncertainty in the digital approximation to the analog input signal. The interpolating comparator unit 22 determines an M-bit digital word representing the location of the analog input signal in the range defined by the outputs of capacitor array 21. The SAR 25 is modified to accept updates to its digital approximation M bits at a time. As explained below, interpolating comparator unit 22 produces two or more bits per cycle of the digital word or approximation to be determined, as opposed to the single bit per cycle of the Gray et al., architecture. In this manner, conversion speed may be increased.

Figure 4:
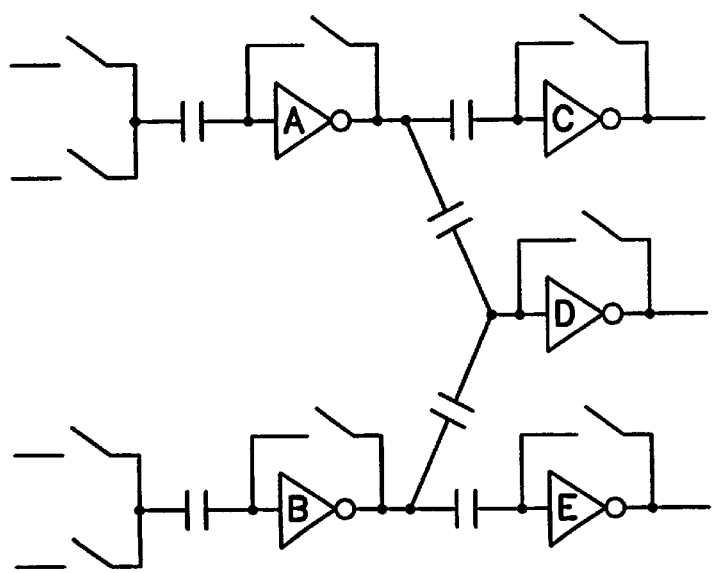
FIG. 4 illustrates an example of an interpolating comparator useful in interpolating comparator unit 22 of the analog-to-digital converter of FIG. 3.

An exemplary design of an interpolating comparator is shown in FIG. 4. This comparator design was disclosed by Kusumoto et al., in the paper entitled "A 10b 20 MHZ 30 mW Pipelined Interpolating CMOS ADC," published in the Digest of Technical Papers, ISSCC, 1993, pp. 62–63. In that work the comparator was used to increase the resolution of a two-step converter. The central idea is the capacitive interpolation achieved between the complementary-metal-oxide-semiconductor (CMOS) gain stages eliminates the need for a number of gain stages as well as the reference voltage taps. The comparator shown in FIG. 4 achieves two bits of resolution while employing only three extra gain stages.

Figure 5A:
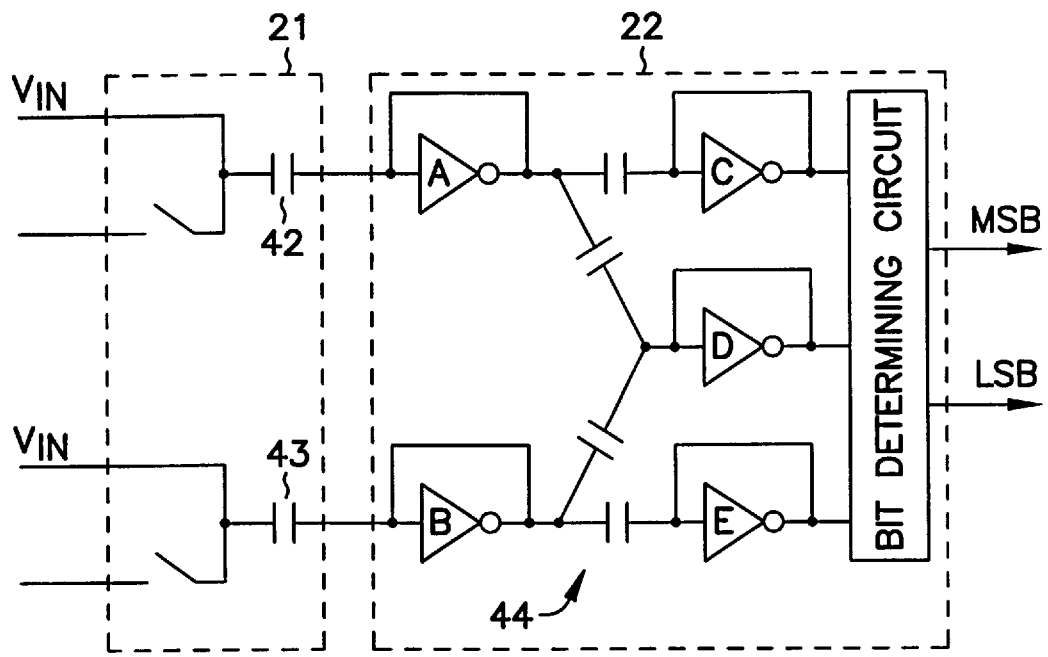
FIGS. 5A, 5B and 5C illustrate a an example of a sequence of events in the operation of the exemplary embodiment of the improved analog-to-digital converter according to the present invention.
Figure 5B:
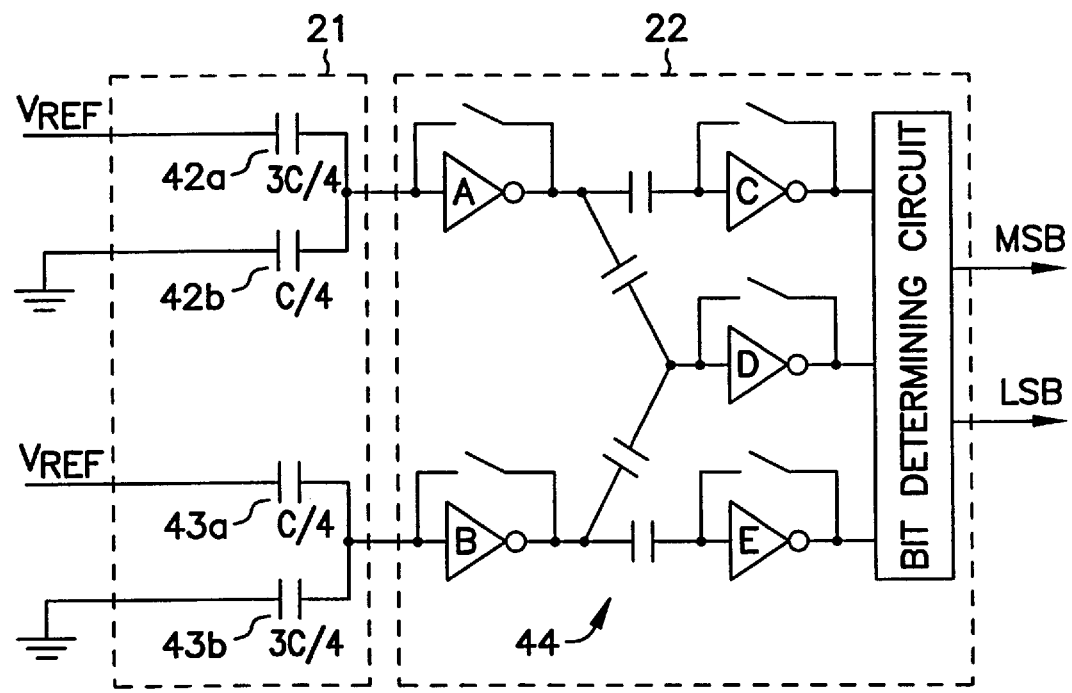
Figure 5C:
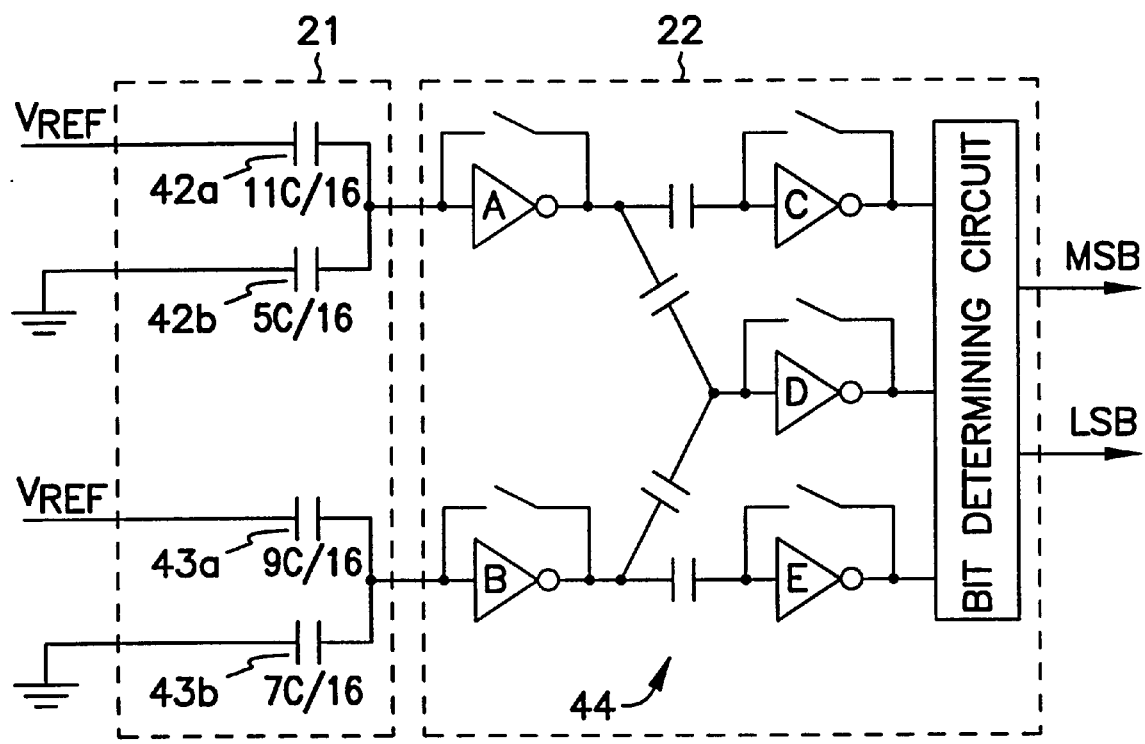

One possible single-ended scheme to use the comparator of FIG. 4 in the architecture of the present invention is shown in FIG. 5. The input signal $V_{IN}$ is sampled into gain stages A and B of interpolating comparator 44, from two capacitor arrays 42 and 43, when the reset switches for all gain stages are closed, as shown in FIG. 5A. When the comparator is amplifying during the first clock cycle, shown in FIG. 5B, three fourths of the upper array 42a is connected to the reference voltage and the remainder 42b is grounded while these connections are reversed on the bottom lower array (43a, 43b). The resulting outputs of gain stages C, D and E are proportional to $(V_{IN}-3V_{REF}/4)$, $(V_{IN}-V_{REF}/2)$ and $(V_{IN}-V_{REF}/4)$, respectively. These outputs are sufficient to determine the two most significant bits of the conversion, in bit determining circuit 45, and once they are known they can be loaded into the SAR 25, and the next pair of bits may be determined. If, for example, the first cycle determined that $$V_{REF}/2 < V_{IN} < 3V_{REF}/4,$$

the switch configuration to determine the next significant pair of bits would result in the connections shown in FIG. 5C, where 11/16 of the upper array is connected to $V_{REF}$ and the remainder grounded and 9/16 of the lower array is connected to $V_{REF}$ and the remainder grounded. The resulting outputs of gain stages C, D and E of comparator 44 are proportional to $(V_{IN}-11V_{REF}/16)$, $(V_{IN}-10V_{REF}/16)$ and $(V_{IN}-9V_{REF}/16)$, respectively and sufficient to determine the next most significant pair of bits. This procedure is carried on, determining two bits at a time, until the conversion is complete. While this scheme appears very attractive, it is only one possibility, and not necessarily optimum.

Referring back to FIG. 3, the exemplary embodiment of the converter of the present invention thus operates to produce two bits of the digital approximation to the analog input signal on each successive approximation. The two bits produced each cycle are shown as output from interpolating comparator unit 22 in parallel for input to digital control and sequencing circuit 25, which controls the configuration of the capacitor arrays 42 and 43. While the exemplary embodiment shows parallel output of bits, the bits could be communicated in a serial mode.

Thus, the present invention provides a successive approximation, charge redistribution analog-to-digital converter wherein more than one bit can be determined on each cycle. As used herein, the term "cycle" shall mean a sequence of circuit events which provides a redistribution of charge on the capacitors that allows one byte, or two or more bits to be simultaneously determined by the interpolating comparator. Only one exemplary embodiment of the invention has been shown, and others skilled in the art will recognize that many alternative embodiments are possible. Further, although the invention has been illustrated with respect to determining two bits a time, the invention may be extended to determine more than two bits at a time by extension of the interpolative comparator and capacitor array.

What is claimed is:

1. A method of successive approximation of a digital representation of an analog input signal using a binary weighted capacitor array for charge redistribution and a comparator receiving the output of the array wherein the bits of the digital approximation are determined on successive cycles, the method characterized in that the comparator is an interpolative comparator and in that more than one bit of the digital approximation is determined on each successive cycle.

2. A method according to claim 1 further wherein the interpolative comparator is a CMOS device.

3. A method of converting an analog input signal by successive approximation to a digital approximation of the input signal using charge redistribution, arrays of binary-weighted capacitors, and an interpolative comparator, comprising the steps of:

a) applying an analog input signal to a capacitor array with inputs and outputs;

b) sampling outputs from the capacitor array using an interpolative comparator;

c) switching the interpolative comparator into an amplification mode and applying the outputs of the capacitor array to the interpolative comparator, applying a reference voltage to inputs of the capacitor array with the array configured in accordance with any previously determined bits of the digital approximation to provide a charge redistribution causing the outputs of the interpolative comparator to produce signals that can be used to determine more than one bit of the digital approximation;

d) determining more than one bit of the digital approximation from the outputs of the interpolative comparator; and e) using the bits determined in step d), repeating at least steps c) and d) to determine more than one additional bits of the digital approximation, the additional bits determined different from those previously determined in step d).

4. A method of converting an analog input signal by successive approximation to a digital approximation of the input signal using charge redistribution, arrays of binary-weighted capacitors, and an interpolative comparator, comprising the steps of:

a) applying an analog input signal to the respective inputs of N capacitor arrays, where N is an integer greater than or equal to 2;

b) sampling respective output signals, related to the analog input signal, from the N capacitor arrays using an interpolative comparator having N inputs and (N**2)−1 outputs;

c) switching the interpolative comparator into an amplification mode and applying the respective outputs of the capacitor arrays to the respective inputs of the interpolative comparator, applying a reference voltage to respective inputs of the N capacitor arrays with the arrays configured in accordance with any previously determined bits of the digital approximation to provide a charge redistribution causing the outputs of the interpolative comparator to produce signals that can be used to determine N bits of the digital approximation;

d) determining N bits of the digital approximation from the outputs of the interpolative comparator; and e) repeating at least steps c) and d) to determine N additional bits of the digital approximation, the N additional bits different from those previously determined in step d).

5. A charge redistribution, successive approximation analog-to-digital converter which produces a digital approximation of an analog input signal, the converter including a binary weighted capacitor array, an interpolative comparator receiving the output of the array, and a memory circuit holding a word of digital data comprising successive approximation of the digital approximation, the word of digital data including at least two bits determined from the output of the interpolative comparator.

* * * * *